US012757605B2

(12) United States Patent
Wang et al.

(10) Patent No.: US 12,757,605 B2
(45) Date of Patent: Oct. 6, 2026

(54) COLOR CONVERSION SUBSTRATE AND METHOD FOR MANUFACTURING SAME, AND DISPLAY PANEL

(71) Applicants: Chengdu BOE Optoelectronics Technology Co., Ltd., Chengdu (CN); BOE Technology Group Co., Ltd., Beijing (CN)

(72) Inventors: Qiyun Wang, Beijing (CN); Jaeho Lee, Beijing (CN); Dongyu Gao, Beijing (CN); Cheng Zeng, Beijing (CN); Jinglu Bai, Beijing (CN); Li Chen, Beijing (CN); Zhenye Wei, Beijing (CN); Lulin Ma, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 446 days.

(21) Appl. No.: 18/283,456

(22) PCT Filed: Feb. 10, 2023

(86) PCT No.: PCT/CN2023/075498
§ 371 (c)(1),
(2) Date: Sep. 22, 2023

(87) PCT Pub. No.: WO2024/164324
PCT Pub. Date: Aug. 15, 2024

(65) Prior Publication Data
US 2025/0040391 A1 Jan. 30, 2025

(51) Int. Cl.
*H10K 59/38* (2023.01)
*H10K 59/12* (2023.01)
(Continued)

(52) U.S. Cl.
CPC ......... *H10K 59/38* (2023.02); *H10K 59/1201* (2023.02); *H10K 59/122* (2023.02); *H10K 59/878* (2023.02); *H10K 59/8792* (2023.02)

(58) Field of Classification Search
CPC .. H10K 59/38; H10K 59/1201; H10K 59/122; H10K 59/878; H10K 59/8792; H10K 50/856; H10K 59/35
See application file for complete search history.

(56) References Cited

U.S. PATENT DOCUMENTS

2016/0006995 A1 1/2016 Yun et al.
2016/0041430 A1 2/2016 Lee et al.
(Continued)

FOREIGN PATENT DOCUMENTS

CN 204576024 U 8/2015
CN 112447802 A 3/2021
(Continued)

OTHER PUBLICATIONS

Wo2017033771, machine translation (Year: 2017).*

*Primary Examiner* — Tracie Y Green
(74) *Attorney, Agent, or Firm* — XSENSUS LLP

(57) ABSTRACT

Provided is a color conversion substrate. The color conversion substrate includes: a base substrate; a reflective isolation portion on a side of the base substrate, a plurality of pixel apertures being defined in the reflective isolation portion, wherein the plurality of pixel apertures include a plurality of first-type pixel apertures arranged in arrays and a plurality of second-type pixel apertures arranged in arrays, and a plurality of lines of the first-type pixel apertures and a plurality of lines of the second-type pixel apertures are alternately arranged; and a color conversion layer, including a first color conversion pattern, a second color conversion pattern, and a transmission pattern, wherein the first color conversion pattern and the transmission pattern are disposed
(Continued)

A-A’ in different first-type pixel apertures, and the second color conversion pattern is disposed in the plurality of second-type pixel apertures.

19 Claims, 7 Drawing Sheets

(51) Int. Cl.
*H10K 59/122* (2023.01)
*H10K 59/80* (2023.01)

(56) References Cited

U.S. PATENT DOCUMENTS

| | | | | |
|---|---|---|---|---|
| 2019/0018286 | A1* | 1/2019 | Kim | G02F 1/133504 |
| 2021/0066648 | A1 | 3/2021 | Chung et al. | |
| 2021/0143223 | A1 | 5/2021 | Rho | |
| 2021/0305314 | A1* | 9/2021 | Su | H10H 20/856 |
| 2021/0335893 | A1 | 10/2021 | Baek et al. | |
| 2022/0231087 | A1 | 7/2022 | Jeon et al. | |
| 2022/0246684 | A1 | 8/2022 | Kim et al. | |
| 2022/0384531 | A1* | 12/2022 | Xu | H10K 59/122 |

FOREIGN PATENT DOCUMENTS

| | | | |
|---|---|---|---|
| CN | 112786661 | A | 5/2021 |
| CN | 113555389 | A | 10/2021 |
| CN | 214378428 | U | 10/2021 |
| CN | 114823794 | A | 7/2022 |
| CN | 114823805 | A | 7/2022 |
| WO | 2017/033771 | A1 | 3/2017 |

* cited by examiner

COLOR CONVERSION SUBSTRATE AND METHOD FOR MANUFACTURING SAME, AND DISPLAY PANEL

CROSS-REFERENCE TO RELATED APPLICATION

This application is a U.S. national stage of international application No. PCT/CN2023/075498, filed on Feb. 10, 2023, the disclosure of which is incorporated herein by reference in its entirety.

TECHNICAL FIELD

The present disclosure relates to the field of display technologies, and in particular, relates to a color conversion substrate and a method for manufacturing the same, and a display panel.

BACKGROUND

With the development of the display technologies, requirements and application ranges of display devices are increasing. Common display devices include mobile phones, televisions, tablet computers, laptop computers, and monitors.

SUMMARY

Embodiments of the present disclosure provide a color conversion substrate and a method for manufacturing the same, and a display panel. The technical solutions are as follows.

In some embodiments of the present disclosure, a color conversion substrate is provided. The color conversion substrate includes:

- a base substrate;
- a reflective isolation portion on a side of the base substrate, a plurality of pixel apertures being defined in the reflective isolation portion, wherein the plurality of pixel apertures include a plurality of first-type pixel apertures arranged in arrays and a plurality of second-type pixel apertures arranged in arrays, and a plurality of lines of the first-type pixel apertures and a plurality of lines of the second-type pixel apertures are alternately arranged; and
- a color conversion layer, including a first color conversion pattern, a second color conversion pattern, and a transmission pattern, wherein the first color conversion pattern and the transmission pattern are disposed in different first-type pixel apertures, and the second color conversion pattern is disposed in the plurality of second-type pixel apertures;
- wherein the second-type pixel apertures are not defined in a first region in the color conversion substrate for defining a same line of the first-type pixel apertures, and the first-type pixel apertures are not defined in a second region in the color conversion substrate for defining a same line of the second-type pixel apertures.

In some embodiments, the plurality of first-type pixel apertures and the plurality of second-type pixel apertures are both arranged in a plurality of columns in a first direction and a plurality of rows in a second direction, wherein in the first direction, a distance between two adjacent first-type pixel apertures in each of the plurality of rows of the first-type pixel apertures is greater than a distance between two adjacent second-type pixel apertures in each of the plurality of rows of the second-type pixel apertures.

In some embodiments, in the isolation portion, at least one first auxiliary aperture is further defined between the two adjacent first-type pixel apertures in the each of the plurality of rows of the first-type pixel apertures, and between the two adjacent second-type pixel apertures in the each of the plurality of columns of the second-type pixel apertures.

In some embodiments, two first auxiliary apertures are juxtaposed between the two adjacent first-type pixel apertures in the each of the plurality of rows of the first-type pixel apertures,

- wherein in the first direction, a distance between one of the two juxtaposed first auxiliary apertures and the first-type pixel aperture adjacent to the one of the two juxtaposed first auxiliary apertures is equal to a distance between the other of the two juxtaposed first auxiliary apertures and the first-type pixel aperture adjacent to the other of the two juxtaposed first auxiliary apertures.

In some embodiments, in the first direction, a distance between the two juxtaposed first auxiliary apertures is greater than or equal to a distance between the first-type pixel aperture and the first auxiliary aperture adjacent to the first-type pixel aperture.

In some embodiments, in the second direction, a width of the at least one first auxiliary aperture is greater than or equal to a width of each of the plurality of first-type pixel apertures.

In some embodiments, a distance between the first-type pixel aperture and the first auxiliary aperture adjacent to the first-type pixel aperture ranges from 10 μm to 25 μm in the first direction, and/or, a distance between the second-type pixel aperture and the first auxiliary aperture adjacent to the second-type pixel aperture ranges from 10 μm to 25 μm in the second direction.

In some embodiments, the color conversion substrate further includes: a first block portion in the at least one first auxiliary aperture, wherein a light absorption rate of the first block portion is greater than a light absorption rate of the isolation portion.

In some embodiments, the color conversion substrate further includes: a second block portion on the side of the base substrate, wherein a light absorption rate of the second block portion is greater than a light absorption rate of the isolation portion, the second block portion and the isolation portion are disposed on a same layer but made of different materials, and an orthogonal projection of the second block portion on the base substrate is between orthogonal projections of the two adjacent first-type pixel apertures in the each of the plurality of rows of the first-type pixel apertures on the base substrate.

In some embodiments, in the case that two first auxiliary apertures are juxtaposed between the two adjacent first-type pixel apertures in the each of the plurality of rows of the first-type pixel apertures, the orthogonal projection of the second block portion on the base substrate is between orthogonal projections of the two juxtaposed first auxiliary apertures on the base substrate.

In some embodiments, the color conversion substrate further includes: a first auxiliary block portion and/or a second auxiliary block portion on the side of the base substrate; wherein

- the first auxiliary block portion and the second block portion are disposed on a same layer and made of a same material, and an orthogonal projection of the first auxiliary block portion on the base substrate is between orthogonal projections of two adjacent rows of the pixel apertures on the base substrate; and the second auxiliary block portion and the second block portion are disposed on a same layer and made of a same material, and an orthogonal projection of the second auxiliary block portion on the base substrate is between orthogonal projections of two adjacent columns of the pixel apertures on the base substrate.

In some embodiments, a material of the isolation portion includes an organic material in gray or white, and a material of the second block portion includes an organic material in black.

In some embodiments, a second auxiliary aperture is further defined in the isolation portion, wherein the second auxiliary aperture is disposed between the two adjacent first-type pixel apertures in the each of the plurality of columns of the first-type pixel apertures, and between the two adjacent second-type pixel apertures in the each of the plurality of rows of the second-type pixel apertures.

In some embodiments, in the second direction, a width of the second auxiliary aperture is greater than or equal to a width of each of the plurality of second-type pixel apertures.

In some embodiments, a distance between the second-type pixel aperture and the second auxiliary aperture adjacent to the second-type pixel aperture ranges from 10 μm to 25 μm in the first direction, and/or, a distance between the first-type pixel aperture and the second auxiliary aperture adjacent to the first-type pixel aperture ranges from 10 μm to 25 μm in the second direction.

In some embodiments, the each of the plurality of rows of the first-type pixel apertures include a plurality of first pixel sub-apertures and a plurality of second pixel sub-apertures that are alternately arranged, wherein the first color conversion pattern is disposed in the plurality of first pixel sub-apertures, and the transmission pattern is disposed in the plurality of second pixel sub-apertures.

In some embodiments, the first color conversion pattern in the plurality of first pixel sub-apertures includes red quantum dots for converting blue light to red light, and scattered particles for scattering light;

the transmission pattern in the plurality of second pixel sub-apertures includes scattered particles for scattering light; and the second color conversion pattern in the plurality of second-type pixel apertures includes green quantum dots for converting blue light to green light, and scattered particles for scattering light.

In some embodiments, the color conversion substrate further includes: an auxiliary package layer on a side, facing away from the base substrate, of the color conversion layer and a color stop layer on a side, facing away from the base substrate, of the auxiliary package layer, wherein the color stop layer includes a red color stop block, a green stop block, and a blue stop block, wherein an orthogonal projection of the red color stop block on the base substrate covers an orthogonal projection of each of the plurality of first pixel sub-apertures on the base substrate, an orthogonal projection of the blue color stop block on the base substrate covers an orthogonal projection of each of the plurality of second pixel sub-apertures on the base substrate, and an orthogonal projection of the green color stop block on the base substrate covers an orthogonal projection of each of the plurality of second-type pixel apertures on the base substrate.

In some embodiments of the present disclosure, a method for manufacturing a color conversion substrate is provided. The method includes:

forming a reflective isolation portion on a side of the base substrate, wherein a plurality of pixel apertures are defined in the isolation portion, wherein the plurality of pixel apertures include a plurality of first-type pixel apertures arranged in arrays and a plurality of second-type pixel apertures arranged in arrays, and a plurality of lines of the first-type pixel apertures and a plurality of lines of the second-type pixel apertures are alternately arranged; and forming a color conversion layer on the base substrate where the isolation portion is formed, wherein the color conversion layer includes a first color conversion pattern, a second color conversion pattern, and a transmission pattern, wherein the first color conversion pattern and the transmission pattern are disposed in different first-type pixel apertures, and the second color conversion pattern is disposed in the plurality of second-type pixel apertures;

wherein the second-type pixel apertures are not defined in a first region in the color conversion substrate for defining a same line of the first-type pixel apertures, and the first-type pixel apertures are not defined in a second region in the color conversion substrate for defining a same line of the second-type pixel apertures.

In some embodiments of the present disclosure, a display panel is provided. The display panel includes: a display substrate and the above color conversion substrate.

BRIEF DESCRIPTION OF DRAWINGS

For clearer description of the technical solutions in the embodiments of the present disclosure, the following briefly describes the accompanying drawings required for describing the embodiments. Apparently, the accompanying drawings in the following description show merely some embodiments of the present disclosure, and those of ordinary skill in the art may still derive other drawings from these accompanying drawings without any creative efforts.

DETAILED DESCRIPTION

To make the objectives, technical solutions, and advantages of the present disclosure clearer, the embodiments of the present disclosure are further described in detail hereinafter with reference to the accompanying drawings.

At present, quantum dot materials, as new light-emitting materials, are being more and more widely used in the display panel of the display device. Generally, the display panel includes a display substrate, and a quantum dot conversion layer on a light-emitting side of the display substrate. The quantum dot conversion layer is capable of converting light emitted by the display substrate to light of other colors. For example, the display substrate emits blue light, and the quantum dot conversion layer includes red quantum dots and green quantum dots. The red quantum dots convert the blue light emitted by the display substrate to red light, and the green quantum dots convert the blue light emitted by the display substrate to green light.

A display panel including the quantum dot conversion layer generally includes an isolation portion. The isolation portion is provided with a plurality of pixel apertures, and the quantum dot conversion layer is disposed in the pixel apertures. The quantum dot conversion layers in two adjacent pixel apertures are generally of different types, for example, a quantum dot conversion layer in one of the two adjacent pixel apertures is configured to convert blue light to red light, and a quantum dot conversion layer in the other of the two adjacent pixel apertures is configured to convert blue light to green light, such that the isolation portion between two pixel apertures of two pixels requires to be made of an organic material in black to avoid the poor phenomenon of the cross color of the display panel caused by emission of the light from the side face of the pixel aperture to the adjacent pixel aperture.

However, in light excited by the quantum dot conversion layer, a ratio of the light with the great view angle (that is, light with a great angle between an emission direction and a normal line, for example, 45°) is great, and the light with the great view angle is prone to being adsorbed by the isolation portion in black, such that the luminous efficiency of the current display panel including the quantum dot conversion layer is less, and the overall luminance of the display panel is poor.

Figure 1:
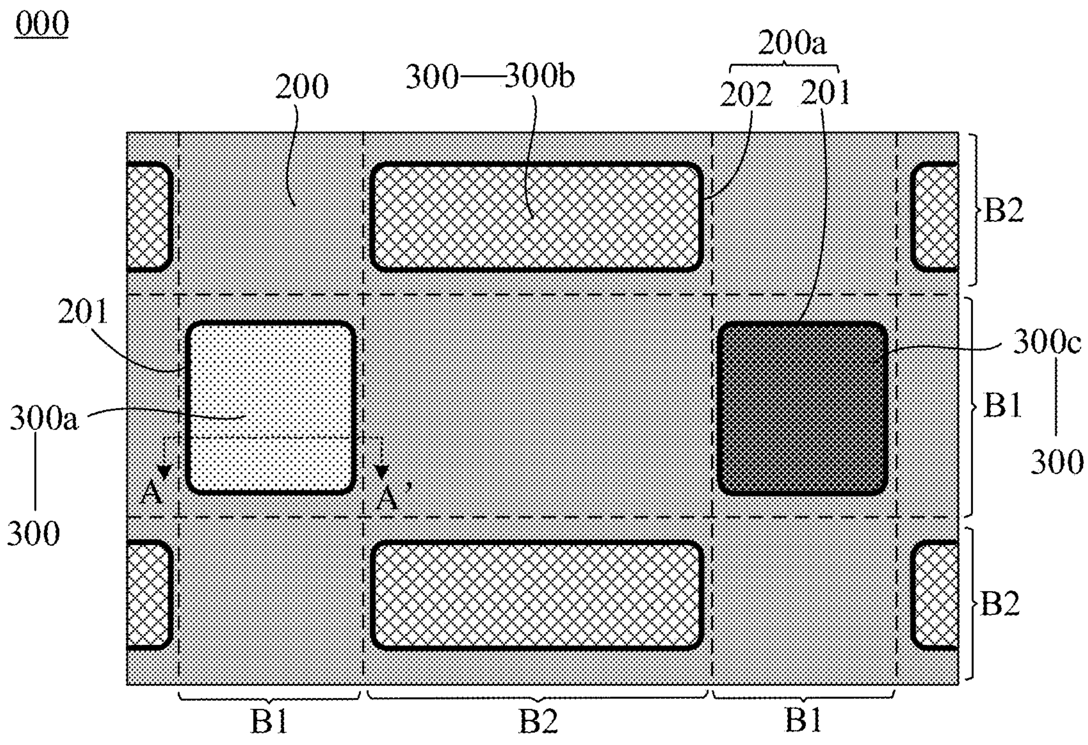
FIG. 1 is a top view of a color conversion substrate according to some embodiments of the present disclosure.
Figure 2:
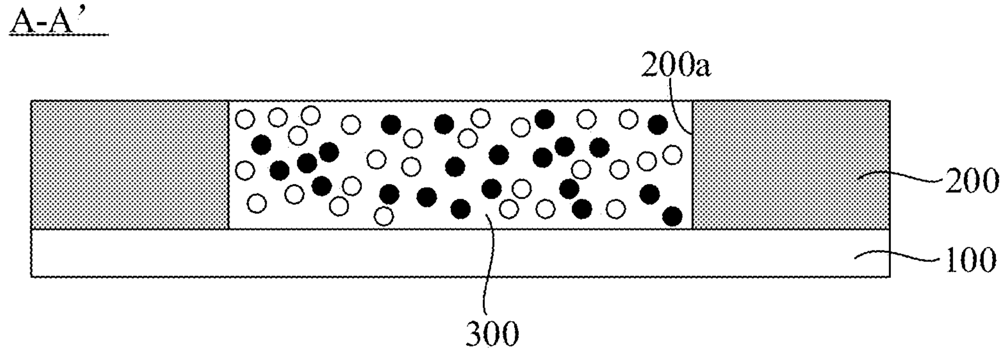
FIG. 2 is a schematic diagram of a film structure of the color conversion substrate shown in FIG. 1 at a position of A-A'.

Referring to FIG. 1 and FIG. 2, FIG. 1 is a top view of a color conversion substrate according to some embodiments of the present disclosure, and FIG. 2 is a schematic diagram of a film structure of the color conversion substrate shown in FIG. 1 at a position of A-A'. The color conversion substrate 000 includes: a base substrate 100 and a reflective isolation portion 200 on a side of the base substrate 100.

The isolation portion 200 in the color conversion substrate 000 further includes a plurality of pixel apertures 200*a*. The plurality of pixel apertures 200*a* in the isolation portion 200 include a plurality of first-type pixel apertures 201 arranged in arrays and a plurality of second-type pixel apertures 202 arranged in arrays, and a plurality of lines of the first-type pixel apertures 201 and a plurality of lines of the second-type pixel apertures 202 are alternately arranged. Illustratively, the plurality of first-type pixel apertures 201 are arranged in a plurality of rows and a plurality of columns, the plurality of second-type pixel apertures 202 are arranged in a plurality of rows and a plurality of columns, and the plurality of rows of the first-type pixel apertures 201 and a plurality of rows of the second-type pixel apertures 202 are alternately arranged. That is, one row of second-type pixel apertures 202 are disposed between two adjacent rows of first-type pixel apertures 201. The plurality of columns of the first-type pixel apertures 201 and the plurality of columns of the second-type pixel apertures 202 are also alternately arranged. That is, one column of second-type pixel apertures 202 are disposed between two adjacent columns of first-type pixel apertures 201.

In the embodiments of the present disclosure, the color conversion substrate 000 further includes a color conversion layer 300. The color conversion layer 300 includes a first color conversion pattern 300*a*, a second color conversion pattern 300*b*, and a transmission pattern 300*c*. The first color conversion pattern 300*a* and the transmission pattern 300*c* in the color conversion layer 300 are disposed in different first-type pixel apertures 201, and the second color conversion pattern 300*b* in the color conversion layer 300 is disposed in the plurality of second-type pixel apertures 202.

In some embodiments, the first color conversion pattern 300*a* and the second color conversion pattern 300*b* in the color conversion layer 300 are configured to convert light of a specific color to light of other colors, and the transmission pattern 300*c* in the color conversion layer 300 does not convert the light of the specific color.

In the present disclosure, the second-type pixel apertures 202 are not defined in a first region B1 in the color conversion substrate 000 for defining a same line of the first-type pixel apertures 201, and the first-type pixel apertures 201 are not defined in a second region B2 in the color conversion substrate 000 for defining a same line of the second-type pixel apertures 202. That is, one line (that is, one row or one column) of the first-type pixel apertures 201 are defined in the first region B1 in the color conversion substrate 000, and the second-type pixel apertures 202 are not defined in the first region B1. Likewise, one line (that is, one row or one column) of the second-type pixel apertures 202 are defined in the second region B2 in the color conversion substrate 000, and the first-type pixel apertures 201 are not defined in the second region B2.

Figure 3:
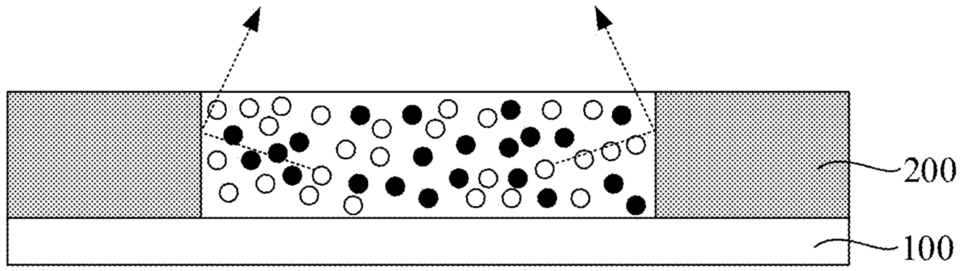
FIG. 3 is a schematic diagram of a light path of the color conversion substrate shown in FIG. 2.

In this case, as the isolation portion in the color conversion substrate 000 is reflective, upon integration of the color conversion substrate 000 in the display panel, referring to FIG. 3, FIG. 3 is a schematic diagram of a light path of the color conversion substrate shown in FIG. 2, in the light excited by the color conversion layer 300, the light with the great view angle is reflected to the pixel apertures 200*a* by the isolation portion 200, such that the light reflected to the pixel apertures 200*a* is normally emitted outwards. As such, the luminous efficiency of such display panel is efficiently improved, and the overall luminance of such display panel is great.

It should be noted that the reflectivity of the isolation portion in black in some practices is generally less than 10%, and the isolation portion 200 in the color conversion substrate 000 in the present disclosure is in gray or white to ensure the reflectivity of the isolation portion 200. In some embodiments, in the case that the isolation portion 200 is in gray, the material of the isolation portion 200 includes an organic material in gray. In some embodiments, white particles and black particles are introduced to a transparent organic material, or black particles with a less percentage are introduced to a transparent organic material, the isolation portion 200 in gray is acquired upon curing, and a reflectivity of the isolation portion 200 in gray ranges from 40% to 80%. In some embodiments, in the case that the isolation portion 200 is in white, the material of the isolation portion 200 includes an organic material in white. In some embodiments, white particles with a great percentage are introduced to a transparent organic material, the isolation portion 200 in white is acquired upon curing, and a reflectivity of the isolation portion 200 in white ranges from 70% to 90%.

It should be noted that the reflectivity of the isolation portion in the embodiments of the present disclosure indicates a reflectivity of an isolation portion with a thickness of 10 μm to light with a wavelength of 550 nm.

A light absorption rate of the isolation portion 200 in gray or in white is less than a light absorption rate of the isolation portion in black, and a transmittance of the isolation portion 200 in gray or in white is greater than a transmittance of the isolation portion in black. As the plurality of lines of the first-type pixel apertures 201 and the plurality of lines of the second-type pixel apertures 202 in the isolation portion 200 are alternately arranged, the second-type pixel apertures 202 are not defined in the first region B1 in the color conversion substrate 000 for defining the same line of the first-type pixel apertures 201, and the first-type pixel apertures 201 are not defined in the second region B2 in the color conversion substrate 000 for defining the same line of the second-type pixel apertures 202, even though the light absorption rate of the isolation portion 200 is reduced and the transmittance of the isolation portion 200 is improved as the isolation portion 200 is reflective, most of the light from the periphery of the first-type pixel aperture 201 does not transmit the isolation portion 200 to the second-type pixel aperture 202, and most of the light from the periphery of the second-type pixel aperture 202 does not transmit the isolation portion 200 to the first-type pixel aperture 201, such that the possibility of the poor phenomenon of the cross color of the display panel integrated with the color conversion substrate 000 is efficiently reduced.

Figure 4:
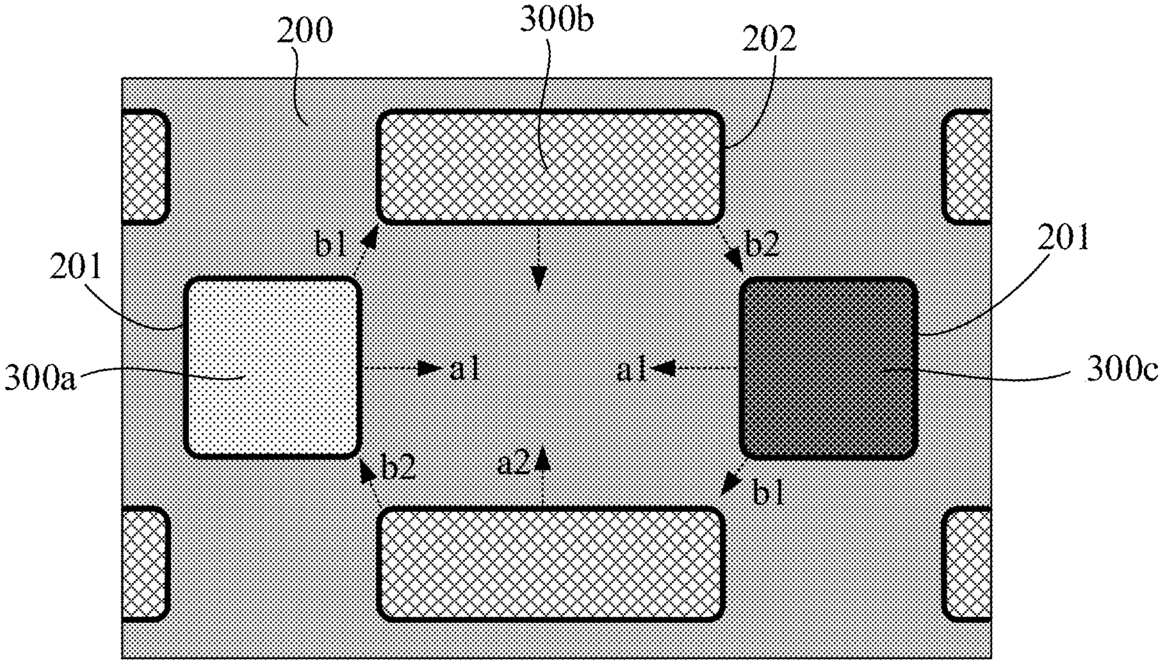
FIG. 4 is a schematic diagram of a light path of the color conversion substrate shown in FIG. 1.

For example, an orthogonal projection of the first-type pixel aperture 201 on the base substrate 100 and an orthogonal projection of the second-type pixel aperture 202 on the base substrate 100 are in rectangular shapes. In this case, as shown in FIG. 4, FIG. 4 is a schematic diagram of a light path of the color conversion substrate shown in FIG. 1. Light a1 from four sides of the first-type pixel aperture 201 only emits to the adjacent first-type pixel aperture 201, and does not emit to the second-type pixel aperture 202, and light b1 from four corners of the first-type pixel aperture 201 emits to the second-type pixel aperture 202. An intensity of the light b1 from corners of the first-type pixel aperture 201 is greatly less than an intensity of the light a1 from four sides of the first-type pixel aperture 201, thereby avoiding the case where the light from the periphery of the first-type pixel aperture 201 emits to the second-type pixel aperture 202. Likewise, light a2 from four sides of the second-type pixel aperture 202 only emits to the adjacent second-type pixel aperture 202, and does not emit to the first-type pixel aperture 201, and light b2 from four corners of the second-type pixel aperture 202 emits to the first-type pixel aperture 201. An intensity of the light b2 from corners of the second-type pixel aperture 202 is greatly less than an intensity of the light a2 from four sides of the second-type pixel aperture 202, thereby avoiding the case where the light from the periphery of the second-type pixel aperture 202 emits to the first-type pixel aperture 201.

In summary, the color conversion substrate in the embodiments includes: a base substrate, a reflective isolation portion on a side of the base substrate, and a color conversion layer. As the isolation portion in the color conversion substrate is reflective, upon disposing of such color conversion substrate in the display panel, light with a great view angle is reflected to a pixel aperture by the isolation portion, such that light reflected to the pixel aperture is normally emitted outwards. As such, the luminous efficiency of the display panel is efficiently improved, and the overall luminance of the display panel is great. Furthermore, as a plurality of lines of first-type pixel apertures and a plurality of lines of second-type pixel apertures in the isolation portion are alternately arranged, the second-type pixel apertures are not defined in a first region in the color conversion substrate for defining a same line of the first-type pixel apertures, and the first-type pixel apertures are not defined in a second region in the color conversion substrate for defining a same line of the second-type pixel apertures, even though the light absorption rate of the isolation portion is reduced and the transmittance of the isolation portion is improved as the isolation portion is reflective, most of the light from a periphery of the first-type pixel aperture does not transmit the isolation portion to the second-type pixel aperture, and most of the light from a periphery of the second-type pixel aperture does not transmit the isolation portion to the first-type pixel aperture, such that the possibility of the poor phenomenon of the cross color of the display panel integrated with the color conversion substrate is efficiently reduced, and the display effect of the display panel is great.

Figure 5:
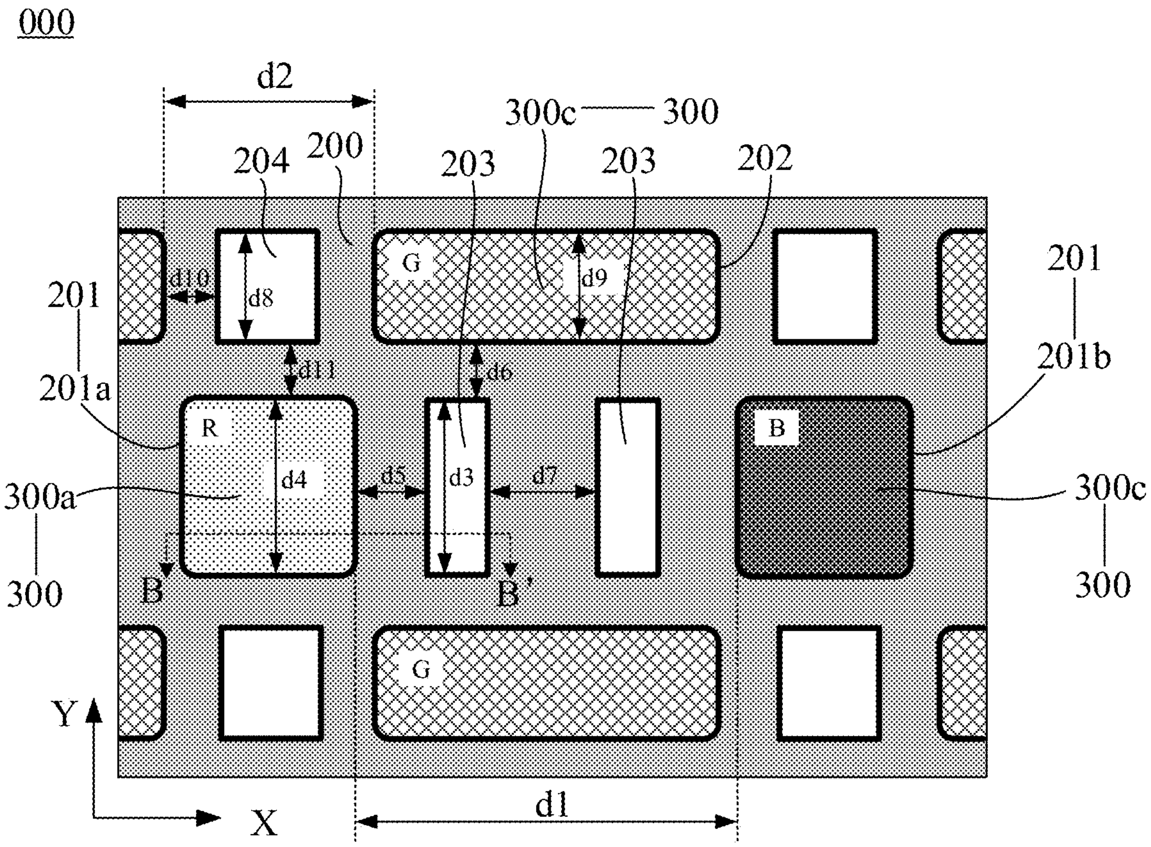
FIG. 5 is a top view of another color conversion substrate according to some embodiments of the present disclosure.

In the embodiments of the present disclosure, as shown in FIG. 5, FIG. 5 is a top view of another color conversion substrate according to some embodiments of the present disclosure. The plurality of first-type pixel apertures 201 and the plurality of second-type pixel apertures 202 are both arranged in a plurality of columns in a first direction X and a plurality of rows in a second direction Y.

The first color conversion pattern 300*a* is are not defined in one part of one row of first-type pixel apertures 201, and the transmission pattern 300*c* is defined in the other part of one row of first-type pixel apertures 201. The first color conversion pattern 300*a* or the transmission pattern 300*c* is defined in one pixel apertures in one row of first-type pixel apertures 201. The second color conversion pattern 300*b* is defined in the second-type pixel apertures 202.

Illustratively, one row of first-type pixel apertures 201 include a plurality of first pixel sub-apertures 201*a* and a plurality of second pixel sub-apertures 201*b* that are alternately arranged. That is, one second pixel sub-aperture 201*b* is disposed between two adjacent first pixel sub-apertures 201*a* in each row of first-type pixel apertures 201. The first color conversion pattern 300*a* is disposed in the plurality of first pixel sub-apertures 201*a*, and the transmission pattern 300*c* is disposed in the plurality of second pixel sub-apertures 201*b*.

Illustratively, the first color conversion pattern 300*a* is capable of converting blue light to red light, the second color conversion pattern 300*b* is capable of converting blue light to green light, and the blue light is still the blue light upon running through the transmission pattern 300*c*. In this case, in the display panel integrated with the color conversion substrate 000, the first color conversion pattern 300*a* is a part of red sub-pixels R in the display panel, the second color conversion pattern 300*b* is a part of green sub-pixels G in the display panel, and the transmission pattern 300*c* is a part of blue sub-pixels B in the display panel. In this case, sub-pixels in the display panel are arranged in the RBGG manner, that is, one red sub-pixel R, one blue sub-pixel B, and two green sub-pixels G compose one pixel.

In some embodiments, the transmission pattern 300*c* is disposed in the second-type pixel apertures 202, the second color conversion pattern 300*b* is disposed in the second pixel sub-apertures 201*b*, and the first color conversion pattern 300*a* is disposed in the first pixel sub-apertures 201*a*. In this case, sub-pixels in the display panel are arranged in the RGBB manner, that is, one red sub-pixel R, one green sub-pixel G, and two blue sub-pixels B compose one pixel, which is not limited in the embodiments of the present disclosure. It should be noted that the following embodiments of the present disclosure are described by taking the sub-pixels in the display panel being arranged in the RGBB manner as an example.

In the present disclosure, in the first direction X, a distance d1 between two adjacent first-type pixel apertures 201 in each of the plurality of rows of the first-type pixel apertures 201 is greater than a distance d2 between two adjacent second-type pixel apertures 202 in each of the plurality of rows of the second-type pixel apertures 202.

As such, a distance between the first pixel sub-aperture 201*a* and the second pixel sub-aperture 201*b* that are adjacent in one row of first-type pixel apertures 201 in the first direction X is great, such that in one row of first-type pixel apertures 201, an intensity of light, running through the isolation portion 200 and irradiated to the second pixel sub-aperture 201*b*, in the light from the periphery of the first pixel sub-aperture 201*a* is less, and an intensity of light, running through the isolation portion 200 and irradiated to the first pixel sub-aperture 201*a*, in the light from the periphery of the second pixel sub-aperture 201*b* is less. As such, the possibility of the poor phenomenon of the cross color of the display panel integrated with the color conversion substrate 000 is efficiently reduced.

Illustratively, in the case that the sub-pixels in the display panel are arranged in the RGBB manner, the second-type pixel apertures 202 are not defined in the first region B1 in the color conversion substrate 000 for defining the same line of the first-type pixel apertures 201, and the first-type pixel apertures 201 are not defined in the second region B2 in the color conversion substrate 000 for defining the same line of the second-type pixel apertures 202, the possibility of the cross color between the green sub-pixels G and the red sub-pixels R is less, and the possibility of the cross color between the green sub-pixels G and the blue sub-pixel B is less. In the case that the distance between the first pixel sub-aperture 201*a* and the second pixel sub-aperture 201*b* that are adjacent in one row of first-type pixel apertures 201 is great, the possibility of the cross color between the red sub-pixels R and the blue sub-pixel B is less.

In the present disclosure, as the plurality of columns of the first-type pixel apertures 201 and the plurality of columns of the second-type pixel apertures 202 are alternately arranged, and the distance d1 between two adjacent first-type pixel apertures 201 in each of the plurality of rows of the first-type pixel apertures 201 is greater than the distance d2 between two adjacent second-type pixel apertures 202 in each of the plurality of rows of the second-type pixel apertures 202 in the first direction X, a distance between two adjacent columns of first-type pixel apertures 201 is greater than a distance between two adjacent columns of second-type pixel apertures 202. In this case, a width of the second-type pixel aperture 202 in the first direction X is greater than a width of the first-type pixel aperture 201 in the first direction X. Illustratively, in some embodiments, the orthogonal projection of the first-type pixel aperture 201 on the base substrate 100 is in a square shape, and the orthogonal projection of the second-type pixel aperture 202 on the base substrate 100 is in a strip shape. Sides of the square are equal or not equal to a width of the strip, which is not limited in the embodiments of the present disclosure. It should be noted that an orthogonal projection of the pixel aperture on the base substrate 100 is also in other shapes, for example, in a circle shape, in an oval shape, in a diamond shape, and the like, which is not limited in the embodiments of the present disclosure.

It should be noted that the patterns in the pixel apertures 200*a* in the color conversion layer 300 are formed by the inkjet printing process. For example, ink droplets are printed in the pixel apertures 200*a* by a print head, and the color conversion layer 300 is formed upon curing of the ink droplets. In the case that the orthogonal projection of the pixel apertures 200*a* on the base substrate 100 is in a rectangle shape, the orthogonal projection of the pixel apertures 200*a* on the base substrate 100 is designed in a rectangle shape with rounded corners for great spreading of the ink droplets in the pixel apertures 200*a*. As such, the uniformity of the thickness of the color conversion layer 300 formed in the pixel apertures 200*a* is efficiently improved.

In the case that the distance between two adjacent first-type pixel apertures 201 of each row of first-type pixel apertures 201 in the first direction X is great, for example, greater than diameters of the ink droplets printed in the inkjet printing process, in the process of forming the pattern in the first-type pixel aperture 201 in the color conversion layer 300 by the inkjet printing process, the ink droplets are prone to staying on a side, facing away from the base substrate 100, of the isolation portion 200, such that pollutants formed due to curing of the ink droplets are formed on the side, facing away from the base substrate 100, of the isolation portion 200. The pollutants may affect subsequent processes, such that the manufactured display panel is prone to the poor phenomenon of dead pixels.

Figure 6:
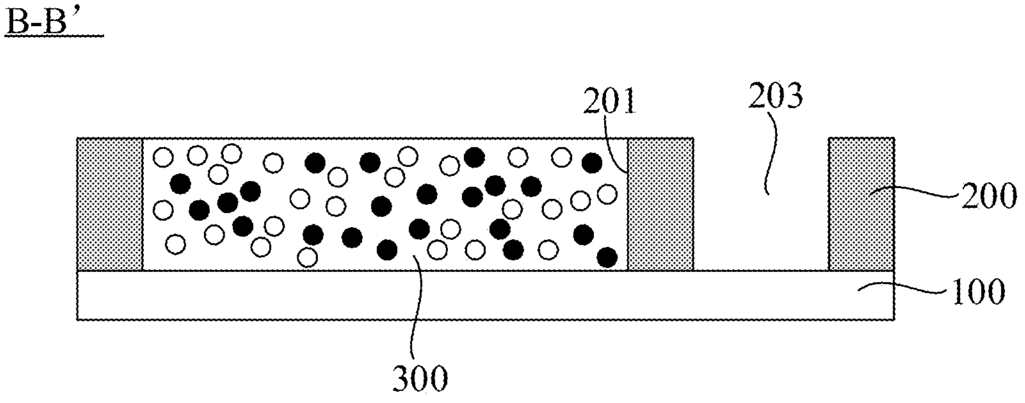
FIG. 6 is a schematic diagram of a film structure of the color conversion substrate shown in FIG. 5 at a position of B-B'.

Thus, in the present disclosure, as shown in FIG. 5 and FIG. 6, FIG. 6 is a schematic diagram of a film structure of the color conversion substrate shown in FIG. 5 at a position of B-B'. In the isolation portion 200, at least one first auxiliary aperture 203 is defined between the two adjacent first-type pixel apertures 201 in each of the plurality of rows of the first-type pixel apertures 201. Illustratively, at least one first auxiliary aperture 203 is defined between the first pixel sub-aperture 201*a* and the second pixel sub-aperture 201*b* that are adjacent in one row of first-type pixel apertures 201. By disposing the first auxiliary aperture 203 between two adjacent first-type pixel apertures 201 in each of the plurality of rows of the first-type pixel apertures 201, a distance between the first auxiliary aperture 203 and the adjacent first-type pixel aperture 201 in the first direction X is less. For example, the diameters of the ink droplets printed in the inkjet printing process are less, and in the process of forming the pattern in the first-type pixel aperture 201 in the color conversion layer 300 by the inkjet printing process, at least part of the ink droplets printed on the side, facing away from the base substrate 100, of the isolation portion 200 smoothly flow in the first-type pixel aperture 201 or the first auxiliary aperture 203, such that the pollutants formed due to curing of the ink droplets are not formed in a region, close to the first-type pixel aperture 201, in a face, facing away from the base substrate 100, of the isolation portion 200, and the possibility of the poor phenomenon of dead pixels in the manufactured display panel is less.

The at least one first auxiliary aperture 203 between two adjacent first-type pixel apertures 201 is also defined between two adjacent second-type pixel apertures 202 in each of the plurality of columns of the second-type pixel apertures 202. Likewise, in the process of forming the pattern in the second-type pixel aperture 202 in the color conversion layer 300 by the inkjet printing process, at least part of the ink droplets printed on the side, facing away from the base substrate 100, of the isolation portion 200 smoothly flow in the second-type pixel aperture 202 or the first auxiliary aperture 203.

In some embodiments, in the second direction Y, a width d3 of the first auxiliary aperture 203 is greater than or equal to a width d4 of the first-type pixel aperture 201, such that ink droplets printed to a position between the first auxiliary aperture 203 and the first-type pixel aperture 201 flow in the first auxiliary aperture 203 or the first-type pixel aperture 201.

In the present disclosure, a distance d5 between the first-type pixel aperture 201 and the first auxiliary aperture 203 adjacent to the first-type pixel aperture 201 ranges from 10 μm to 25 μm in the first direction X, and/or, a distance d6 between the second-type pixel aperture 202 and the first auxiliary aperture 203 adjacent to the second-type pixel aperture 202 ranges from 10 μm to 25 μm in the second direction Y. In this case, as diameters of ink droplets printed by the print head in the inkjet printing process range from 10 μm to 25 μm, ink droplets printed to a position between the first auxiliary aperture 203 and the first-type pixel aperture 201 flow in the first auxiliary aperture 203 or the first-type pixel aperture 201 in the case that the distance d5 between the first-type pixel aperture 201 and the first auxiliary aperture 203 adjacent to the first-type pixel aperture 201 ranges from 10 μm to 25 μm in the first direction X, and ink droplets printed to a position between the first auxiliary aperture 203 and the second-type pixel aperture flow in the first auxiliary aperture 203 or the second-type pixel aperture in the case that the distance d6 between the second-type pixel aperture 202 and the first auxiliary aperture 203 adjacent to the second-type pixel aperture 202 ranges from 10 μm to 25 μm in the second direction Y.

In some embodiments, as shown in FIG. 5, two first auxiliary apertures 203 are juxtaposed between two adjacent first-type pixel apertures 201 in each of the plurality of rows of the first-type pixel apertures 201. In the first direction X, a distance between one of the two juxtaposed first auxiliary apertures 203 and the first-type pixel aperture 201 adjacent to the one of the two juxtaposed first auxiliary apertures 203 is equal to a distance between the other of the two juxtaposed first auxiliary apertures 203 and the first-type pixel aperture 202 adjacent to the other of the two juxtaposed first auxiliary apertures 203. That is, two first auxiliary apertures 203 are juxtaposed between the first pixel sub-aperture 201*a* and the second pixel sub-aperture 201*b* that are adjacent, and in the first direction X, a distance between the first pixel sub-aperture 201*a* and the adjacent first auxiliary aperture 203 is equal to a distance between the second pixel sub-aperture 201*b* and the adjacent first auxiliary aperture 203. As such, in the process of forming the pattern in the first pixel sub-aperture 201*a* in the color conversion layer 300, at least part of ink droplets printed to the side, facing away from the base substrate 100, of the isolation portion 200 flow in the first pixel sub-aperture 201*a* or the first auxiliary aperture 203 adjacent to the first pixel sub-aperture 201*a*; in the process of forming the pattern in the second pixel sub-aperture 201*b* in the color conversion layer 300, at least part of ink droplets printed to the side, facing away from the base substrate 100, of the isolation portion 200 flow in the second pixel sub-aperture 201*b* or the first auxiliary aperture 203 adjacent to the second pixel sub-aperture 201*b*.

In this case, on the premise that the pollutants formed due to curing of the ink droplets are not formed in the isolation portion 200 between the first pixel sub-aperture 201*a* and the adjacent first auxiliary aperture 203, and the pollutants formed due to curing of the ink droplets are not formed in the isolation portion 200 between the second pixel sub-aperture 201*b* and the adjacent first auxiliary aperture 203, a thickness of the isolation portion 200 between the first pixel sub-aperture 201*a* and the second pixel sub-aperture 201*b* is increased, such that the transmittance of the isolation portion 200 between the first pixel sub-aperture 201*a* and the second pixel sub-aperture 201*b* to the light is reduced. The thickness of the isolation portion 200 between the first pixel sub-aperture 201*a* and the second pixel sub-aperture 201*b* indicates a sum of a distance between the first pixel sub-aperture 201*a* and the adjacent first auxiliary aperture 203, a distance between the second pixel sub-aperture 201*b* and the adjacent first auxiliary aperture 203, and a distance between two juxtaposed first auxiliary apertures 203 in the first direction X.

Illustratively, as shown in FIG. 5, in the first direction X, a distance d7 between two juxtaposed first auxiliary apertures 203 is greater than or equal to the distance d5 between the first-type pixel aperture 203 and the first auxiliary aperture 203 adjacent to the first-type pixel aperture 203, such that the thickness of the isolation portion 200 between the first pixel sub-aperture 201*a* and the second pixel sub-aperture 201*b* is great, the transmittance of the isolation portion 200 between the first pixel sub-aperture 201*a* and the second pixel sub-aperture 201*b* to the light is less, and the possibility of the cross color between the red sub-pixels R and the blue sub-pixel B in the display panel is further reduced.

In some embodiments, as shown in FIG. 5, a second auxiliary aperture 204 is further defined in the isolation portion 200. The second auxiliary aperture 204 is disposed between two adjacent first-type pixel apertures 201 in each of the plurality of columns of the first-type pixel apertures 201, and between the two adjacent second-type pixel apertures 202 in each of the plurality of rows of the second-type pixel apertures 202. Based on the second auxiliary aperture 204, ink droplets printed to a position between the second auxiliary aperture 204 and the second-type pixel aperture 202 flow in the second auxiliary aperture 204 or the second-type pixel aperture 202, and ink droplets printed to a position between the second auxiliary aperture 204 and the first-type pixel apertures 2012 flow in the second auxiliary aperture 204 or the first-type pixel apertures 201, such that the possibility of the poor phenomenon of dead pixels in the manufactured display panel is further reduced.

In the present disclosure, in the second direction Y, a width d8 of the second auxiliary aperture 204 is greater than or equal to a width d9 of each of the plurality of second-type pixel apertures 202, such that the ink droplets printed to the position between the second auxiliary aperture 204 and the second-type pixel aperture 202 flow in the second auxiliary aperture 204 or the second-type pixel aperture 202.

In some embodiments, a distance d10 between the second-type pixel aperture 202 and the second auxiliary aperture 204 adjacent to the second-type pixel aperture 202 ranges from 10 μm to 25 μm in the first direction X, and/or, a distance d11 between the first-type pixel aperture 201 and the second auxiliary aperture 204 adjacent to the first-type pixel aperture 201 ranges from 10 μm to 25 μm in the second direction Y. In this case, as diameters of ink droplets printed by the print head in the inkjet printing process are generally 20 μm, ink droplets printed to a position between the second auxiliary aperture 204 and the second-type pixel aperture 202 flow in the second auxiliary aperture 204 or the second-type pixel aperture 202 in the case that the distance d10 between the second-type pixel aperture 202 and the adjacent second auxiliary aperture 204 ranges from 10 μm to 25 μm in the first direction X, and ink droplets printed to a position between the second auxiliary aperture 204 and the first-type pixel aperture 201 flow in the second auxiliary aperture 204 or the first-type pixel aperture 201 in the case that the distance d11 between the first-type pixel aperture 201 and the adjacent second auxiliary aperture 204 ranges from 10 μm to 25 μm in the second direction Y.

In the embodiments of the present disclosure, for further reduction of the possibility of the cross color between the first pixel sub-aperture 201*a* and the second pixel sub-aperture 201*b*, a block portion in black is disposed between the first pixel sub-aperture 201*a* and the second pixel sub-aperture 201*b*. As a light absorption rate of the block portion in black is great, the light, running through the isolation portion 200 and irradiated to the second pixel sub-aperture 201*b*, in the light from the periphery of the first pixel sub-aperture 201*a* is blocked by the block portion, and the light, running through the isolation portion 200 and irradiated to the first pixel sub-aperture 201*a*, in the light from the periphery of the second pixel sub-aperture 201*b* is also blocked by the block portion. The block portion in black between the first pixel sub-aperture 201*a* and the second pixel sub-aperture 201*b* is of various structures, and the embodiments of the present disclosure are described by the following two option implementations as an example.

Figure 7:
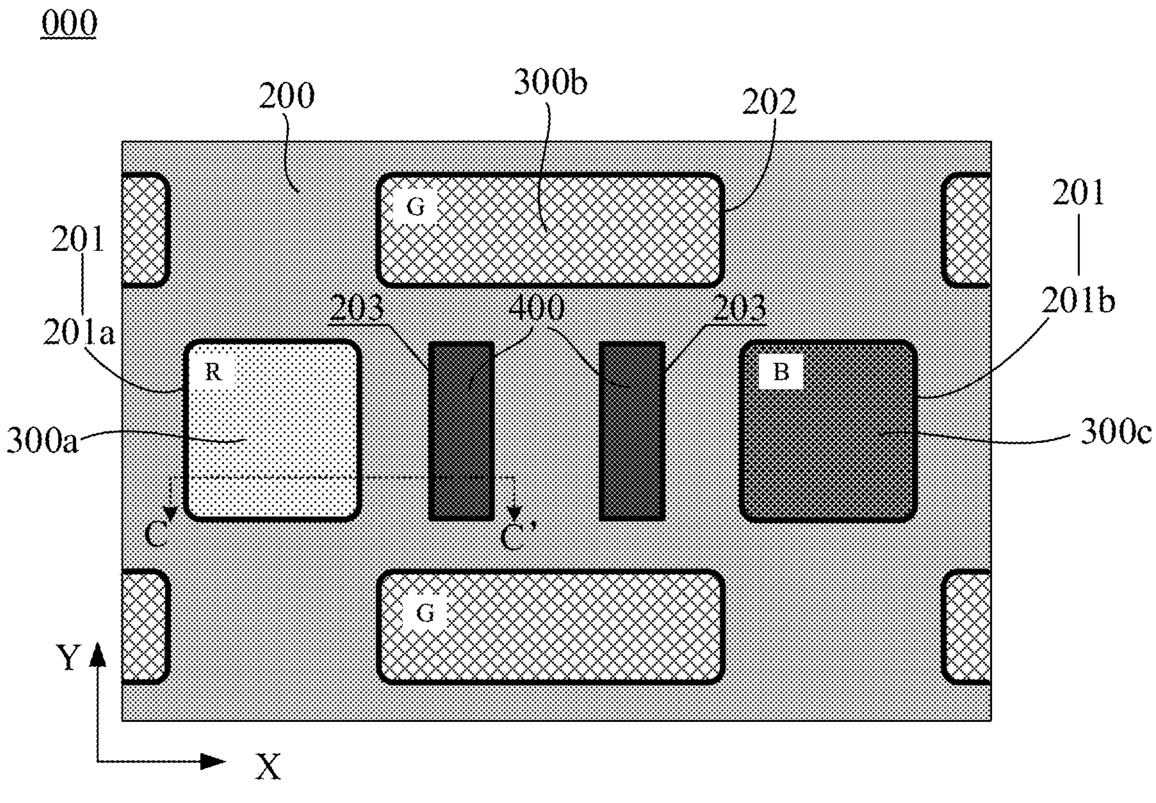
FIG. 7 is a top view of another color conversion substrate according to some embodiments of the present disclosure.
Figure 8:
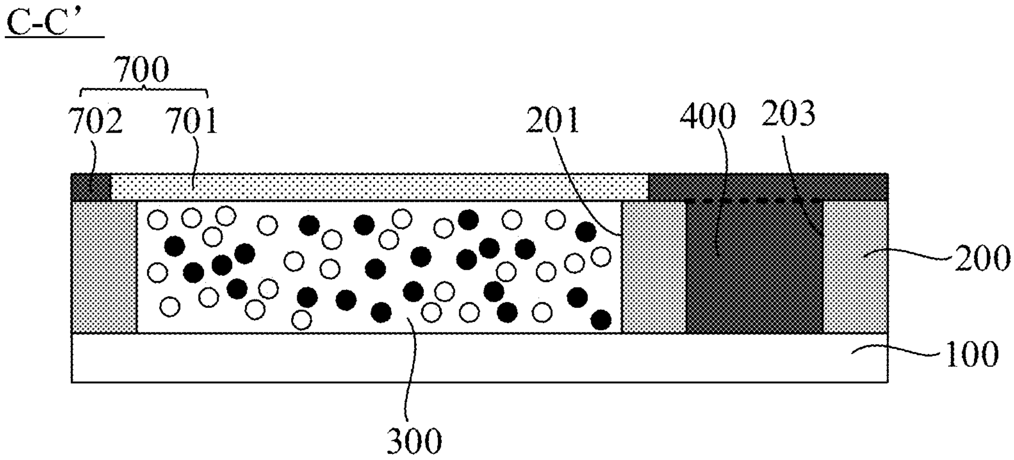
FIG. 8 is a schematic diagram of a film structure of the color conversion substrate shown in FIG. 7 at a position of C-C'.

In a first option implementation, as shown in FIG. 7 and FIG. 8, FIG. 7 is a top view of another color conversion substrate according to some embodiments of the present disclosure, and FIG. 8 is a schematic diagram of a film structure of the color conversion substrate shown in FIG. 7 at a position of C-C'. The color conversion substrate 000 further includes a first block portion 400 in the first auxiliary aperture 203. The first block portion 400 is in black, the isolation portion 200 is in gray or white, and thus a light absorption rate of the first block portion 400 is greater than a light absorption rate of the isolation portion 200. As such, the light absorption rate of the first block portion 400 is ensured to be great, the light, running through the isolation portion 200 and irradiated to the second pixel sub-aperture 201*b*, in the light from the periphery of the first pixel sub-aperture 201*a* is blocked by the first block portion 400 in the first auxiliary aperture 203, and the light, running through the isolation portion 200 and irradiated to the first pixel sub-aperture 201*a*, in the light from the periphery of the second pixel sub-aperture 201*b* is also blocked by the first block portion 400 in the first auxiliary aperture 203. As such, the possibility of the cross color between the red sub-pixels R and the blue sub-pixel B in the display panel is further reduced.

In the embodiments of the present disclosure, for a less possibility of printing to the side, facing away from the base substrate 100, of the isolation portion 200 in the process of printing the color conversion layer 300 by the inkjet printing process, the color conversion layer 300 is first printed by the inkjet printing process, and the first block portion 400 is then filled in the first auxiliary aperture 203.

In some embodiments, as shown in FIG. 8, the color conversion substrate 000 further includes a color stop layer 700 on a side, facing away from the base substrate 100, of the color conversion layer 300 and the isolation portion 200. The color stop layer 700 includes a plurality of color stop blocks 701 in one-to-one correspondence to the plurality of pixel apertures 200*a*, and a black matrix 702 between two adjacent color stop blocks 701. An orthogonal projection of the color stop block 701 on the base substrate 100 covers an orthogonal projection of the corresponding pixel aperture 200*a* on the base substrate 100. The color stop block 701 in the color stop layer 700 is capable of filtering stray light in light from the pattern in the corresponding pixel aperture 200*a* in the color conversion layer 300, and the black matrix 702 in the color stop layer 700 is capable of absorbing light from a side face of the color stop block 701, such that the poor phenomenon of the cross color of the display panel is avoided. In this case, as the black matrix 702 is formed on the side, facing away from the base substrate 100, of the isolation portion 200, part of the black matrix 702 is filled in the first auxiliary aperture 203 upon formation of the black matrix 702 on the side, facing away from the base substrate 100, of the isolation portion 200, such that the part of the black matrix 702 in the first auxiliary aperture 203 is determined as the first block portion 400.

Figure 9:
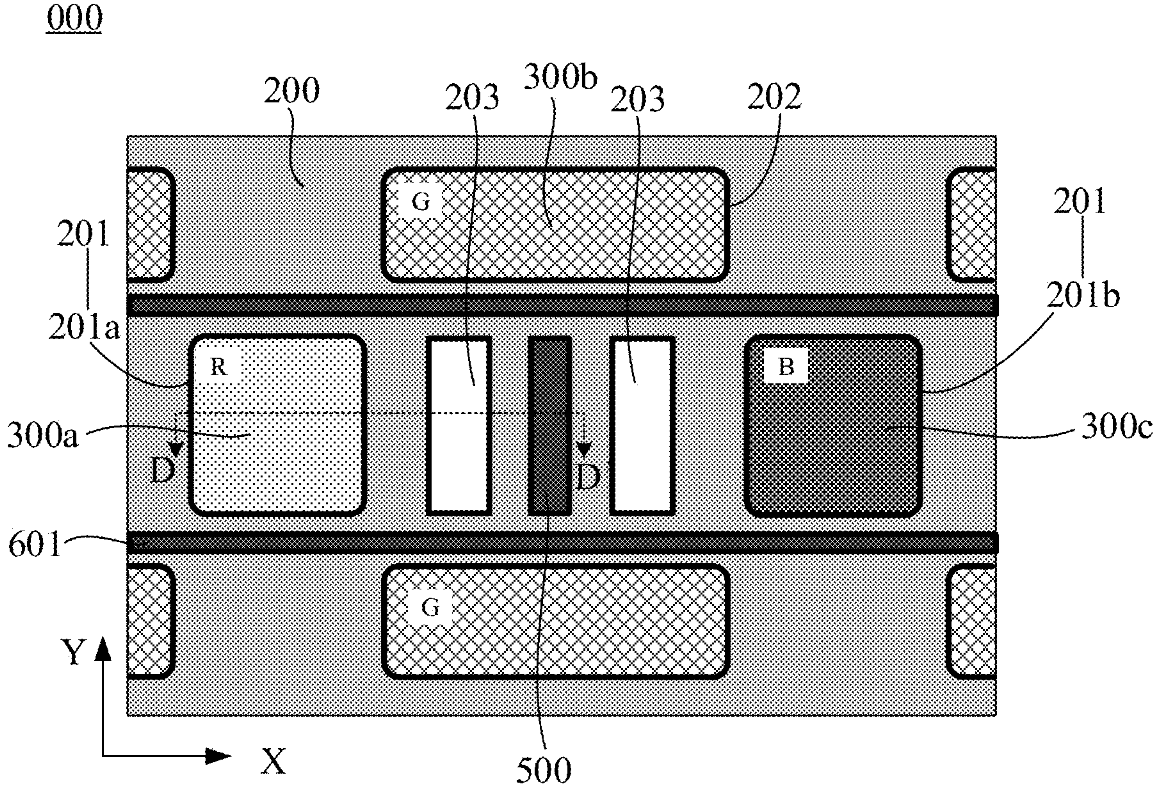
FIG. 9 is a top view of another color conversion substrate according to some embodiments of the present disclosure.
Figure 10:
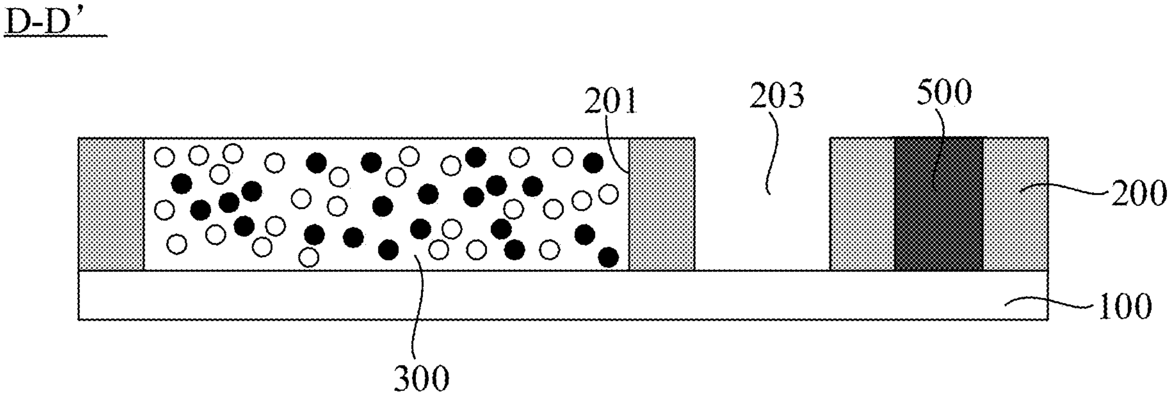
FIG. 10 is a schematic diagram of a film structure of the color conversion substrate shown in FIG. 5 at a position of D-D'.

In a second option implementation, as shown in FIG. 9 and FIG. 10, FIG. 9 is a top view of another color conversion substrate according to some embodiments of the present disclosure, and FIG. 10 is a schematic diagram of a film structure of the color conversion substrate shown in FIG. 5 at a position of D-D'. The color conversion substrate 000 further includes a second block portion 500 on the side of the base substrate. An orthogonal projection of the second block portion 500 on the base substrate 100 is between orthogonal projections of the two adjacent first-type pixel apertures 201 in each of the plurality of rows of the first-type pixel apertures 201 on the base substrate 100. That is, the orthogonal projection of the second block portion 500 on the base substrate 100 is between two adjacent first pixel sub-apertures 201*a*.

The second block portion 500 is in black, the isolation portion 200 is in gray or white, and thus a light absorption rate of the second block portion 500 is greater than a light absorption rate of the isolation portion 200. In addition, the second block portion 500 is in a strip shape, a length direction of the second block portion 500 is parallel to the second direction Y, and a length of the second block portion 500 is greater than or equal to a width of the first-type pixel aperture 201 in the second direction Y. As such, the light absorption rate of the second block portion 500 is ensured to be great, the light, running through the isolation portion 200 and irradiated to the second pixel sub-aperture 201*b*, in the light from the periphery of the first pixel sub-aperture 201*a* is blocked by the second block portion 500, and the light, running through the isolation portion 200 and irradiated to the first pixel sub-aperture 201*a*, in the light from the periphery of the second pixel sub-aperture 201*b* is also blocked by the second block portion 500. As such, the possibility of the cross color between the red sub-pixels R and the blue sub-pixel B in the display panel is further reduced.

In the present disclosure, the second block portion 500 in the color conversion substrate 000 and the isolation portion 200 are disposed on a same layer but made of different materials. It should be noted that the structures on a same layer but made of different materials indicate that the two structures are simultaneously disposed on a side of the film layer in the color conversion substrate 000 and are formed in two different processes. For example, the second block portion 500 and the isolation portion 200 being disposed on a same layer but made of different materials indicates that the second block portion 500 and the isolation portion 200 are simultaneously disposed on the side of the base substrate 100 and are formed in two different processes.

Illustratively, the isolation portion 200 and the second block portion 500 are formed on the side of the base substrate 100 prior to formation of the color conversion layer 300 by the inkjet printing process. A material of the isolation portion 200 includes an organic material in gray or white, and a material of the second block portion 500 includes an organic material in black. For example, black particles with a great percentage are introduced to a transparent organic material, the second block portion 500 in black is acquired upon curing.

In some embodiments, in the case that two first auxiliary apertures 203 are juxtaposed between the two adjacent first-type pixel apertures 201 in each of the plurality of rows of the first-type pixel apertures 201, the orthogonal projection of the second block portion 500 in the color conversion substrate 000 on the base substrate 100 is between orthogonal projections of the two juxtaposed first auxiliary apertures 203 on the base substrate 100. In this case, the first auxiliary apertures 203 are not affected by disposing the second block portion 500 between two adjacent first-type pixel apertures 201, such that the pollutants formed due to curing of the ink droplets on the side, facing away from the base substrate 100, of the isolation portion 200 are efficiently avoided by the first auxiliary apertures 203.

In the embodiments of the present disclosure, the color conversion substrate 000 further includes a first auxiliary block portion 601 and/or a second auxiliary block portion 602 on the side of the base substrate 100. The embodiments of the present disclosure are described by taking the following three cases as an example.

In a first case, as shown in FIG. 9, in the case that the color conversion substrate 000 includes the first auxiliary block portion 601, the first auxiliary block portion 601 and the second block portion 500 are disposed on a same layer and made of a same material. It should be noted that the structures on a same layer and made of a same material indicate that the two structures are simultaneously disposed on a side of the film layer in the color conversion substrate 000 and are formed in a same process. For example, the first auxiliary block portion 601 and the second block portion 500 being disposed on a same layer and made of a same material indicates that the first auxiliary block portion 601 and the second block portion 500 are formed by a one patterning process.

An orthogonal projection of the first auxiliary block portion 601 on the base substrate 100 is between orthogonal projections of two adjacent rows of the plurality of pixel apertures 200*a* on the base substrate 100. That is, the orthogonal projection of the first auxiliary block portion 601 on the base substrate 100 is between an orthogonal projection of one row of the first-type pixel apertures 201 on the base substrate 100 and an orthogonal projection of one adjacent row of the second-type pixel apertures 202 on the base substrate 100. Illustratively, the first auxiliary block portion 601 is in a strip shape, and a length direction of the first auxiliary block portion 601 is parallel to the first direction X.

In this case, as the first auxiliary block portion 601 and the second block portion 500 are made of the same material, the first auxiliary block portion 601 is in black, and a light absorption rate of the first auxiliary block portion 601 is great, such that light from four corners of the first-type pixel aperture 201 and irradiated to the second-type pixel aperture 202 is blocked by the first auxiliary block portion 601, and light from four corners of the second-type pixel aperture 202 and irradiated to the first-type pixel aperture 201 is blocked by the first auxiliary block portion 601. As such, the poor phenomenon of the cross color between the first-type pixel aperture 201 and the second-type pixel aperture 202 is further avoided by the first auxiliary block portion 601.

Figure 11:
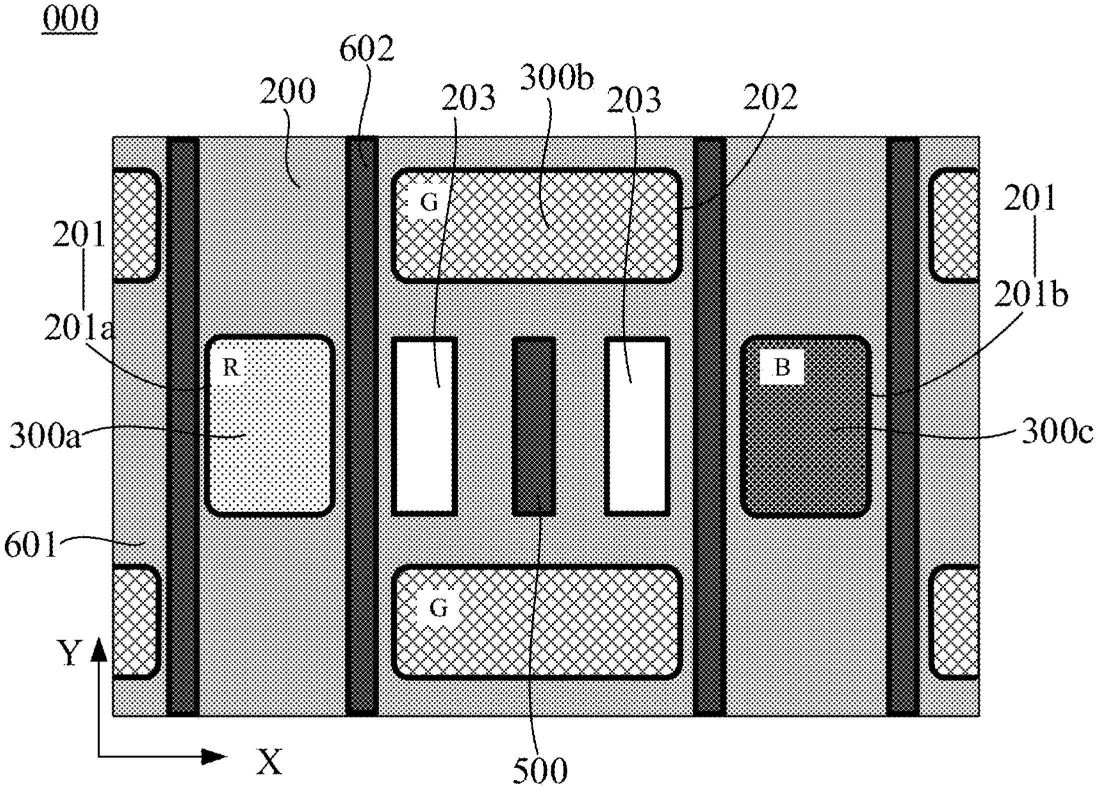
FIG. 11 is a top view of another color conversion substrate according to some embodiments of the present disclosure.

In a second case, as shown in FIG. 11, FIG. 11 is a top view of another color conversion substrate according to some embodiments of the present disclosure. In the case that the color conversion substrate 000 includes the second auxiliary block portion 602, the second auxiliary block portion 602 and the second block portion 500 are disposed on a same layer and made of a same material. An orthogonal projection of the second auxiliary block portion 602 on the base substrate 100 is between orthogonal projections of two adjacent columns of the plurality of pixel apertures 200*a* on the base substrate 100. That is, the orthogonal projection of the second auxiliary block portion 602 on the base substrate 100 is between an orthogonal projection of one column of the first-type pixel apertures 201 on the base substrate 100 and an orthogonal projection of one adjacent column of the second-type pixel apertures 202 on the base substrate 100. Illustratively, the second auxiliary block portion 602 is in a strip shape, and a length direction of the second auxiliary block portion 602 is parallel to the second direction Y.

In this case, as the second auxiliary block portion 602 and the second block portion 500 are made of the same material, the second auxiliary block portion 602 is in black, and a light absorption rate of the second auxiliary block portion 602 is great, such that light from four corners of the first-type pixel aperture 201 and irradiated to the second-type pixel aperture 202 is blocked by the second auxiliary block portion 602, and light from four corners of the second-type pixel aperture 202 and irradiated to the first-type pixel aperture 201 is blocked by the second auxiliary block portion 602. As such, the poor phenomenon of the cross color between the first-type pixel aperture 201 and the second-type pixel aperture 202 is further avoided by the second auxiliary block portion 602.

Figure 12:
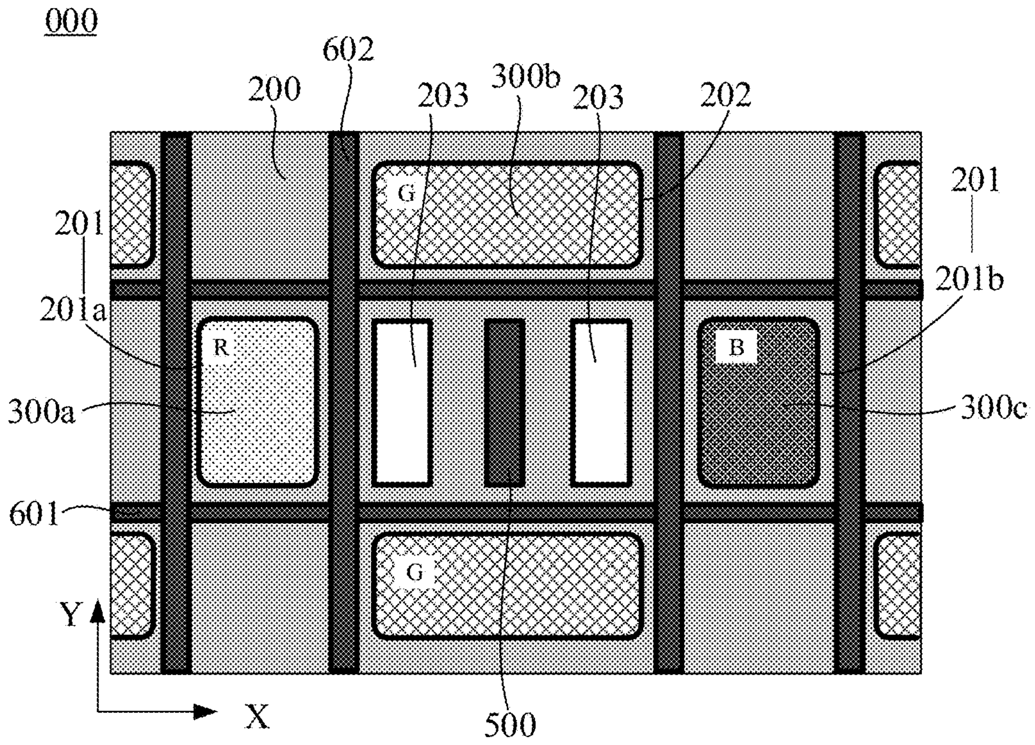
FIG. 12 is a top view of another color conversion substrate according to some embodiments of the present disclosure.

In a third case, as shown in FIG. 12, FIG. 12 is a top view of another color conversion substrate according to some embodiments of the present disclosure. In the case that the color conversion substrate 000 includes the first auxiliary block portion 601 and the second auxiliary block portion 602, the first auxiliary block portion 601 is disposed between two adjacent rows of the pixel apertures 200*a*, and the second auxiliary block portion 602 is disposed between two adjacent columns of the pixel apertures 200*a*. It should be noted that in this case, the structure and function of the first auxiliary block portion 601 are referred to the first auxiliary block portion 601 in the above first case, and the structure and function of the second auxiliary block portion 602 are referred to the second auxiliary block portion 602 in the above second case, which are not repeated herein.

Figure 13:
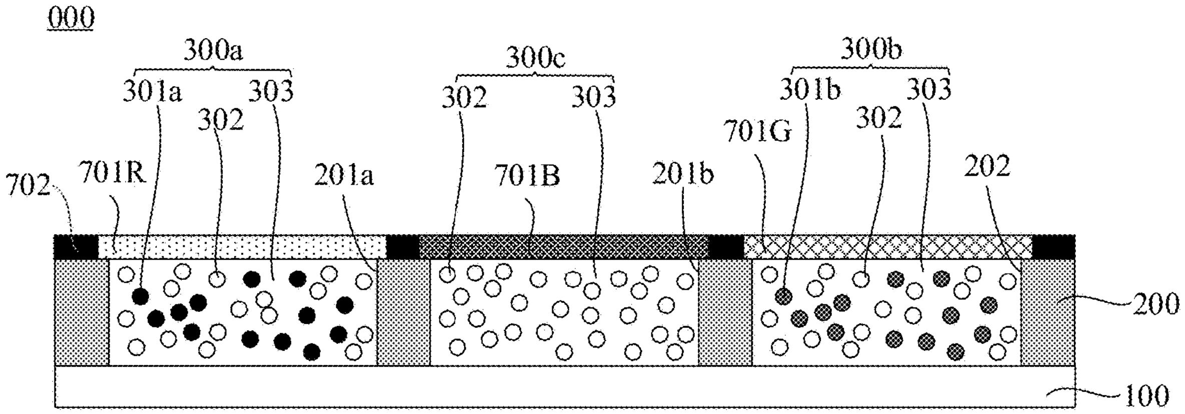
FIG. 13 is a schematic diagram of a film structure of a color conversion substrate according to some embodiments of the present disclosure.

In the embodiments of the present disclosure, as shown in FIG. 13, FIG. 13 is a schematic diagram of a film structure of a color conversion substrate according to some embodiments of the present disclosure. As the first color conversion pattern 300*a* in the first pixel sub-apertures 201*a* includes red quantum dots 301*a* for converting blue light to red light, and scattered particles 302 for scattering light. Illustratively, the red quantum dots 301*a* and the scattered particles 302 are dispersedly distributed in a transparent medium layer 303 in the first pixel sub-apertures 201*a*. Upon integration of the color conversion substrate 000 in the display panel, blue light from the display panel and irradiated to the first color conversion pattern 300*a* in the first pixel sub-apertures 201*a* is converted to red light by the red quantum dots 301*a*, and the blue light and the red light are scattered by the scattered particles 302, such that much blue light is converted to red light by the red quantum dots 301*a*, and an outgoing angle of the converted red light is great, and the view angle of the display panel is great. Thus, the first color conversion pattern 300*a* in the first pixel sub-apertures 201*a* is determined as part of the red sub-pixels R in the display panel.

The transmission pattern 300*c* in the second pixel sub-apertures 201*b* includes scattered particles 302 for scattering light. Illustratively, the scattered particles 302 are dispersedly distributed in a transparent medium layer 303 in the second pixel sub-apertures 201*b*. Upon integration of the color conversion substrate 000 in the display panel, blue light from the display panel and irradiated to the transmission pattern 300*c* in the second pixel sub-apertures 201*b* is scattered by the scattered particles 302, such that an outgoing angle of the blue light is great, and the view angle of the display panel is great. Thus, the transmission pattern 300*c* in the second pixel sub-apertures 201*b* is determined as part of the blue sub-pixels B in the display panel.

The second color conversion pattern 300*b* in the second-type pixel apertures 202 includes green quantum dots 301*b* for converting blue light to green light, and scattered particles for scattering light. Illustratively, the green quantum dots 301*b* and the scattered particles 302 are dispersedly distributed in a transparent medium layer 303 in the second-type pixel apertures 202. Upon integration of the color conversion substrate 000 in the display panel, blue light from the display panel and irradiated to the second color conversion pattern 300*b* in the second-type pixel apertures 202 is converted to green light by the green quantum dots 301*b*, and the blue light and the green light are scattered by the scattered particles 302, such that much blue light is converted to green light by the green quantum dots 301*b*, and an outgoing angle of the converted green light is great, and the view angle of the display panel is great. Thus, the second color conversion pattern 300*b* in the second-type pixel apertures 202 is determined as part of the green sub-pixels G in the display panel.

In the embodiments of the present disclosure, as shown in FIG. 13, the color conversion substrate 000 further includes an auxiliary package layer 800 on a side, facing away from the base substrate 100, of the color conversion layer 300 and a color stop layer 700 on a side, facing away from the base substrate 100, of the auxiliary package layer 800. The auxiliary package layer 800 is configured to package the color conversion layer 300 in the color conversion substrate 000, and the auxiliary package layer 800 ensures that the color conversion layer 300 is not corroded by moisture and oxygen in the external environment.

The color stop layer 700 in the color conversion substrate 000 includes a red color stop block 701R, a green stop block 701G, and a blue stop block 701B. An orthogonal projection of the red color stop block 701R on the base substrate 100 covers an orthogonal projection of the first pixel sub-aperture 201*a* on the base substrate, and the red color stop block 701R is capable of filtering light of other colors than red, such that the red sub-pixels R in the display panel emit pure red light. An orthogonal projection of the blue color stop block 701B on the base substrate 100 covers an orthogonal projection of the second pixel sub-aperture 201*b* on the base substrate 100, and the blue color stop block 701B is capable of filtering light of other colors than blue, such that the blue sub-pixels B in the display panel emit pure blue light. An orthogonal projection of the green color stop block 701G on the base substrate 100 covers an orthogonal projection of the second-type pixel aperture 202 on the base substrate 100, and the green color stop block 701G is capable of filtering light of other colors than green, such that the green sub-pixels G in the display panel emit pure green light.

In the present disclosure, the color stop layer 700 in the color conversion substrate 000 further includes the black matrix 702 between two adjacent color stop blocks, and the poor phenomenon of the cross color of the display panel is efficiently avoided by the black matrix 702.

In summary, the color conversion substrate in the embodiments includes: a base substrate, a reflective isolation portion on a side of the base substrate, and a color conversion layer. As the isolation portion in the color conversion substrate is reflective, upon disposing of such color conversion substrate in the display panel, light with a great view angle is reflected to a pixel aperture by the isolation portion, such that light reflected to the pixel aperture is normally emitted outwards. As such, the luminous efficiency of the display panel is efficiently improved, and the overall luminance of the display panel is great. Furthermore, as a plurality of lines of first-type pixel apertures and a plurality of lines of second-type pixel apertures in the isolation portion are alternately arranged, the second-type pixel apertures are not defined in a first region in the color conversion substrate for defining a same line of the first-type pixel apertures, and the first-type pixel apertures are not defined in a second region in the color conversion substrate for defining a same line of the second-type pixel apertures, even though the light absorption rate of the isolation portion is reduced and the transmittance of the isolation portion is improved as the isolation portion is reflective, most of the light from a periphery of the first-type pixel aperture does not transmit the isolation portion to the second-type pixel aperture, and most of the light from a periphery of the second-type pixel aperture does not transmit the isolation portion to the first-type pixel aperture, such that the possibility of the poor phenomenon of the cross color of the display panel integrated with the color conversion substrate is efficiently reduced, and the display effect of the display panel is great.

Embodiments of the present disclosure further provide a display panel. The display panel includes a display substrate and the color conversion substrate in the above embodiments. Illustratively, the color conversion substrate is the color conversion substrate 000 shown in FIG. 1, FIG. 5, FIG. 7, FIG. 9, FIG. 11, FIG. 12 or FIG. 13.

In the present disclosure, the display panel is a micro-light-emitting diode (micro-LED) display panel, a mini light-emitting diode (mini-LED) display panel, or an organic light-emitting diode (OLED) display panel.

Figure 14:
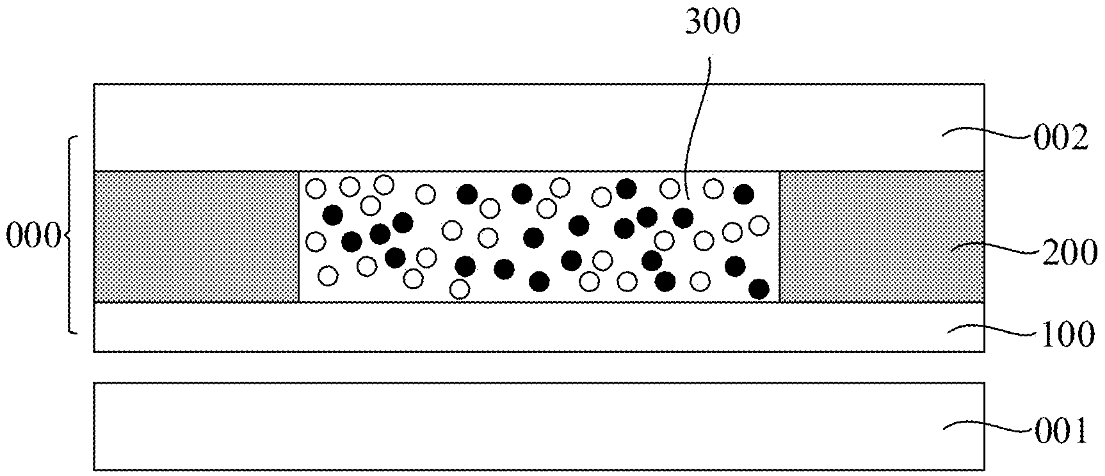
FIG. 14 is a schematic diagram of a film structure of a display panel according to some embodiments of the present disclosure.

In some embodiments, as shown in FIG. 14, FIG. 14 is a schematic diagram of a film structure of a display panel according to some embodiments of the present disclosure. In the case that the display panel is the micro-LED display panel or the mini-LED display panel, the display substrate 001 in the display panel is a light-emitting substrate for emitting blue light, and the light-emitting device in the light-emitting substrate is a micro-LED or a mini-LED. The base substrate 100 in the color conversion substrate 000 is an upper protection layer, and film layers in the color conversion substrate 000 are acquired on a glass substrate 002. In this case, the display substrate 001 in the display panel is opposite to the color conversion substrate 000, and a color conversion layer 300 in the color conversion substrate 000 is closer to the display substrate 001 than the base substrate 100.

Figure 15:
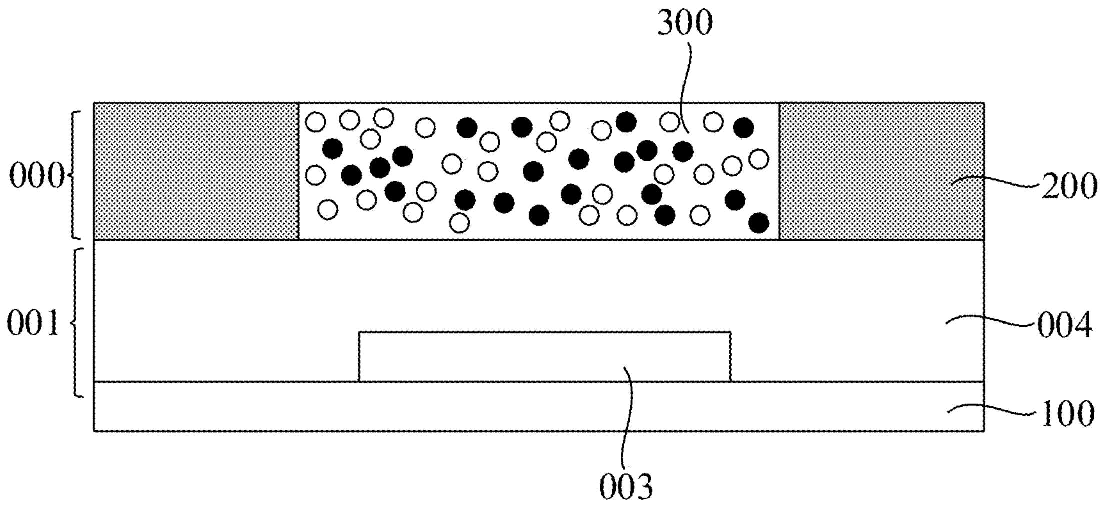
FIG. 15 is a schematic diagram of a film structure of another display panel according to some embodiments of the present disclosure.

In some embodiments, as shown in FIG. 15, FIG. 15 is a schematic diagram of a film structure of another display panel according to some embodiments of the present disclosure. In the case that the display panel is the OLED display panel, the display substrate 001 in the display panel includes an OLED light-emitting device 003 for emitting blue light and a pixel drive circuit (not marked in the drawing) electrically connected to the OLED light-emitting device 003. The OLED light-emitting device 003 is disposed on a side, close to the base substrate 100, of the color conversion layer 300, and the pixel drive circuit is configured to drive the OLED light-emitting device 003 to emit light. In this case, the display panel further includes a package layer 400 for packaging the OLED light-emitting device 003, and an isolation portion in the color conversion substrate 000 is disposed on a side, facing away from the base substrate 001, of the package layer 400.

Embodiments of the present disclosure further provide a display device. The display device is a product or a component with a display function, such as a mobile phone, a tablet computer, a television, a display, a notebook computer, a digital photo frame, a navigator, and the like. The display device further includes a power supply assembly and a display panel electrically connected to the power supply assembly. The display panel is a display panel in the above embodiments, for example, the display panel shown in FIG. 14 or FIG. 15.

Embodiments of the present disclosure further provide a method for manufacturing a color conversion substrate. The method is applicable to manufacturing the color conversion substrate in the above embodiments. The method for manufacturing the color conversion substrate further includes the following processes.

S1, a reflective isolation portion is formed on a side of the base substrate, wherein a plurality of pixel apertures are defined in the isolation portion, wherein the plurality of pixel apertures include a plurality of first-type pixel apertures arranged in arrays and a plurality of second-type pixel apertures arranged in arrays, and a plurality of lines of the first-type pixel apertures and a plurality of lines of the second-type pixel apertures are alternately arranged; and S2, a color conversion layer is formed on the base substrate where the isolation portion is formed, wherein the color conversion layer includes a first color conversion pattern, a second color conversion pattern, and a transmission pattern, wherein the first color conversion pattern and the transmission pattern are disposed in different first-type pixel apertures, and the second color conversion pattern is disposed in the plurality of second-type pixel apertures;

the plurality of second-type pixel apertures are not defined in a first region in the color conversion substrate for defining a same line of the first-type pixel apertures, and the plurality of first-type pixel apertures are not defined in a second region in the color conversion substrate for defining a same line of the second-type pixel apertures.

Those shilled in the art may clearly understand that the processes of the above method for manufacturing the color conversion substrate can be referred to the descriptions of the embodiments of the structure of the above color conversion substrate for convenience and simplification of the description, which is not repeated herein.

It should be noted that in the accompanying drawings, for clarity of the illustration, the dimension of the layers and regions may be scaled up. It should be understood that when an element or layer is described as being "on" another element or layer, the described element or layer may be directly located on other elements or layers, or an intermediate layer may exist. In addition, it should be understood that when an element or layer is described as being "under" another element or layer, the described element or layer may be directly located under other elements, or more than one intermediate layer or element may exist. In addition, it should be further understood that when a layer or element is described as being arranged "between" two layers or elements, the described layer or element may be the only layer between the two layers or elements, or more than one intermediate layer or element may exist. In the whole disclosure, like reference numerals indicate like elements.

In the present disclosure, the terms "first" and "second" are only used for the purpose of description and should not be construed as indicating or implying relative importance or implicitly indicating the number of technical features as indicated. Unless otherwise clearly defined, the expression "a plurality of" refers to two or more.

Described above are example embodiments of the present disclosure, and are not intended to limit the present disclosure. Any modifications, equivalent replacements, improvements and the like made within the spirit and principles of the present disclosure should be included within the scope of protection of the present disclosure.

The invention claimed is:

1. A color conversion substrate, comprising:

a base substrate;

a reflective isolation portion on a side of the base substrate, a plurality of pixel apertures being defined in the reflective isolation portion, wherein the plurality of pixel apertures comprise a plurality of first-type pixel apertures arranged in arrays and a plurality of second-type pixel apertures arranged in arrays, and a plurality of lines of the first-type pixel apertures and a plurality of lines of the second-type pixel apertures are alternately arranged; and a color conversion layer, comprising a first color conversion pattern, a second color conversion pattern, and a transmission pattern, wherein the first color conversion pattern and the transmission pattern are disposed in different first-type pixel apertures, and the second color conversion pattern is disposed in the plurality of second-type pixel apertures;

wherein the second-type pixel apertures are not defined in a first region in the color conversion substrate for defining a same line of the first-type pixel apertures, and the firs-type pixel apertures are not defined in a second region in the color conversion substrate for defining a same line of the second-type pixel apertures; and wherein the plurality of first-type pixel apertures and the plurality of second-type pixel apertures are both arranged in a plurality of columns in a first direction and a plurality of rows in a second direction, wherein in the first direction, a distance between two adjacent first-type pixel apertures in each of the plurality of rows of the first-type pixel apertures is greater than a distance between two adjacent second-type pixel apertures in each of the plurality of rows of the second-type pixel apertures.

2. The color conversion substrate according to claim 1, wherein in the isolation portion, at least one first auxiliary aperture is further defined between the two adjacent first-type pixel apertures in the each of the plurality of rows of the first-type pixel apertures, and between two adjacent second-type pixel apertures in each of the plurality of columns of second-type pixel apertures.

3. The color conversion substrate according to claim 2, wherein two first auxiliary apertures are juxtaposed between the two adjacent first-type pixel apertures in the each of the plurality of rows of the first-type pixel apertures, wherein in the first direction, a distance between one of the two juxtaposed first auxiliary apertures and the first-type pixel aperture adjacent to the one of the two juxtaposed first auxiliary apertures is equal to a distance between the other of the two juxtaposed first auxiliary apertures and the first-type pixel aperture adjacent to the other of the two juxtaposed first auxiliary apertures.

4. The color conversion substrate according to claim 3, wherein in the first direction, a distance between the two juxtaposed first auxiliary apertures is greater than or equal to a distance between the first-type pixel aperture and the first auxiliary aperture adjacent to the first-type pixel aperture.

5. The color conversion substrate according to claim 2, wherein in the second direction, a width of the at least one first auxiliary aperture is greater than or equal to a width of each of the plurality of first-type pixel apertures.

6. The color conversion substrate according to claim 2, wherein the color conversion substrate meets at least one of: a distance between the first-type pixel aperture and the first auxiliary aperture adjacent to the first-type pixel aperture ranges from 10 μm to 25 μm in the first direction, or, a distance between the second-type pixel aperture and the first auxiliary aperture adjacent to the second-type pixel aperture ranges from 10 μm to 25 μm in the second direction.

7. The color conversion substrate according to claim 2, further comprising: a first block portion in the at least one first auxiliary aperture, wherein a light absorption rate of the first block portion is greater than a light absorption rate of the isolation portion.

8. The color conversion substrate according to claim 1, further comprising: a second block portion on the side of the base substrate, wherein a light absorption rate of the second block portion is greater than a light absorption rate of the isolation portion, the second block portion and the isolation portion are disposed on a same layer but made of different materials, and an orthogonal projection of the second block portion on the base substrate is between orthogonal projections of the two adjacent first-type pixel apertures in the each of the plurality of rows of the first-type pixel apertures on the base substrate.

9. The color conversion substrate according to claim 8, wherein in the case that two first auxiliary apertures are juxtaposed between the two adjacent first-type pixel apertures in the each of the plurality of rows of the first-type pixel apertures, the orthogonal projection of the second block portion on the base substrate is between orthogonal projections of the two juxtaposed first auxiliary apertures on the base substrate.

10. The color conversion substrate according to claim 8, further comprising at least one of: a first auxiliary block portion or a second auxiliary block portion on the side of the base substrate; wherein the first auxiliary block portion and the second block portion are disposed on a same layer and made of a same material, and an orthogonal projection of the first auxiliary block portion on the base substrate is between orthogonal projections of two adjacent rows of the pixel apertures on the base substrate; and the second auxiliary block portion and the second block portion are disposed on a same layer and made of a same material, and an orthogonal projection of the second auxiliary block portion on the base substrate is between orthogonal projections of two adjacent columns of the pixel apertures on the base substrate.

11. The color conversion substrate according to claim 8, wherein a material of the isolation portion comprises an organic material in gray or white, and a material of the second block portion comprises an organic material in black.

12. The color conversion substrate according to claim 1, wherein a second auxiliary aperture is further defined in the isolation portion, wherein the second auxiliary aperture is disposed between the two adjacent first-type pixel apertures in the each of the plurality of columns of the first-type pixel apertures, and between the two adjacent second-type pixel apertures in the each of the plurality of rows of the second-type pixel apertures.

13. The color conversion substrate according to claim 12, wherein in the second direction, a width of the second auxiliary aperture is greater than or equal to a width of each of the plurality of second-type pixel apertures.

14. The color conversion substrate according to claim 12, wherein the color conversion substrate meets at least one of: a distance between the second-type pixel aperture and the second auxiliary aperture adjacent to the second-type pixel aperture ranges from 10 μm to 25 μm in the first direction, or, a distance between the first-type pixel aperture and the second auxiliary aperture adjacent to the first-type pixel aperture ranges from 10 μm to 25 μm in the second direction.

15. The color conversion substrate according to claim 1, wherein the each of the plurality of rows of the first-type pixel apertures comprises a plurality of first pixel sub-apertures and a plurality of second pixel sub-apertures that are alternately arranged, wherein the first color conversion pattern is disposed in the plurality of first pixel sub-apertures, and the transmission pattern is disposed in the plurality of second pixel sub-apertures.

16. The color conversion substrate according to claim 15, wherein the first color conversion pattern in the plurality of first pixel sub-apertures comprises red quantum dots for converting blue light to red light, and scattered particles for scattering light;

the transmission pattern in the plurality of second pixel sub-apertures comprises scattered particles for scattering light; and the second color conversion pattern in the plurality of second-type pixel apertures comprises green quantum dots for converting blue light to green light, and scattered particles for scattering light.

17. The color conversion substrate according to claim 16, further comprising: an auxiliary package layer on a side, facing away from the base substrate, of the color conversion layer and a color stop layer on a side, facing away from the base substrate, of the auxiliary package layer, wherein the color stop layer comprises a red color stop block, a green stop block, and a blue stop block, wherein an orthogonal projection of the red color stop block on the base substrate covers an orthogonal projection of each of the plurality of first pixel sub-apertures on the base substrate, an orthogonal projection of the blue color stop block on the base substrate covers an orthogonal projection of each of the plurality of second pixel sub-apertures on the base substrate, and an orthogonal projection of the green color stop block on the base substrate covers an orthogonal projection of each of the plurality of second-type pixel apertures on the base substrate.

18. A method for manufacturing a color conversion substrate, comprising:

forming a reflective isolation portion on a side of the base substrate, wherein a plurality of pixel apertures are defined in the isolation portion, wherein the plurality of pixel apertures comprise a plurality of first-type pixel apertures arranged in arrays and a plurality of second-type pixel apertures arranged in arrays, and a plurality of lines of the first-type pixel apertures and a plurality of lines of the second-type pixel apertures are alternately arranged; and forming a color conversion layer on the base substrate where the isolation portion is formed, wherein the color conversion layer comprises a first color conversion pattern, a second color conversion pattern, and a transmission pattern, wherein the first color conversion pattern and the transmission pattern are disposed in different first-type pixel apertures, and the second color conversion pattern is disposed in the plurality of second-type pixel apertures;

wherein the second-type pixel apertures are not defined in a first region in the color conversion substrate for defining a same line of the first-type pixel apertures, and the first-type pixel apertures are not defined in a second region in the color conversion substrate for defining a same line of the second-type pixel apertures; and wherein the plurality of first-type pixel apertures and the plurality of second-type pixel apertures are both arranged in a plurality of columns in a first direction and a plurality of rows in a second direction, wherein in the first direction, a distance between two adjacent first-type pixel apertures in each of the plurality of rows of the first-type pixel apertures is greater than a distance between two adjacent second-type pixel apertures in each of the plurality of rows of the second-type pixel apertures.

19. A display panel, comprising: a display substrate and a color conversion substrate, wherein the color conversion substrate comprises:

a base substrate;

a reflective isolation portion on a side of the base substrate, a plurality of pixel apertures being defined in the reflective isolation portion, wherein the plurality of pixel apertures comprise a plurality of first-type pixel apertures arranged in arrays and a plurality of second-type pixel apertures arranged in arrays, and a plurality of lines of the first-type pixel apertures and a plurality of lines of the second-type pixel apertures are alternately arranged; and a color conversion layer, comprising a first color conversion pattern, a second color conversion pattern, and a transmission pattern, wherein the first color conversion pattern and the transmission pattern are disposed in different first-type pixel apertures, and the second color conversion pattern is disposed in the plurality of second-type pixel apertures;

wherein the second-type pixel apertures are not defined in a first region in the color conversion substrate for defining a same line of the first-type pixel apertures, and the firs-type pixel apertures are not defined in a second region in the color conversion substrate for defining a same line of the second-type pixel apertures; and wherein the plurality of first-type pixel apertures and the plurality of second-type pixel apertures are both arranged in a plurality of columns in a first direction and a plurality of rows in a second direction, wherein in the first direction, a distance between two adjacent first-type pixel apertures in each of the plurality of rows of the first-type pixel apertures is greater than a distance between two adjacent second-type pixel apertures in each of the plurality of rows of the second-type pixel apertures.

* * * * *